(12) United States Patent
Rowley

(10) Patent No.: US 7,279,974 B2
(45) Date of Patent: Oct. 9, 2007

(54) FULLY DIFFERENTIAL LARGE SWING VARIABLE GAIN AMPLIFIER

(75) Inventor: Matthew D. Rowley, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 193 days.

(21) Appl. No.: 11/150,448

(22) Filed: Jun. 10, 2005

(65) Prior Publication Data
US 2006/0279338 A1    Dec. 14, 2006

(51) Int. Cl.
*H03F 3/45* (2006.01)
(52) U.S. Cl. .................... 330/253; 330/257
(58) Field of Classification Search ........... 330/253, 330/257
See application file for complete search history.

(56) References Cited

U.S. PATENT DOCUMENTS 4,728,900 A * 3/1988 Nakagawara et al. ....... 330/253

* cited by examiner

*Primary Examiner*—Steven J. Mottola
(74) *Attorney, Agent, or Firm*—Alan K. Stewart; W. James Brady, II; Frederick J. Telecky, Jr.

(57) ABSTRACT

The fully differential large swing variable gain amplifier circuit includes: a first 5-transistor transconductor having a common mode node; and a second 5-transistor transconductor having a common mode node coupled to the common mode node of the first 5-transistor transconductor, wherein the second 5-transistor transconductor operates 180 degrees out of phase with the first 5-transistor transconductor.

14 Claims, 2 Drawing Sheets

FULLY DIFFERENTIAL LARGE SWING VARIABLE GAIN AMPLIFIER

FIELD OF THE INVENTION

The present invention relates to electronic circuitry and, in particular, to a fully differential large swing variable gain amplifier.

BACKGROUND OF THE INVENTION

In data communication or linear applications, it is crucial to develop circuits with high bandwidth and low jitter. Additionally, having an amplifier with variable gain allows for circuit topologies which can handle large input dynamic ranges without performance degradation. To this end, fully differential circuits are well known for realizing low jitter circuits due to their inherent common-mode rejection and supply rejection characteristics.

Standard five transistor transconductor circuits have been used as differential to single ended converters (current mode logic (CML) to CMOS converters), but due to their inherent imbalances the jitter performance suffers since the current source will usually be pulled in and out of saturation. These transconductors are very simple, well understood, small, and low-power though, so it is preferable to try and use these circuits.

SUMMARY OF THE INVENTION

A fully differential large swing variable gain amplifier circuit includes: a first 5-transistor transconductor having a common mode node; and a second 5-transistor transconductor having a common mode node coupled to the common mode node of the first 5-transistor transconductor, wherein the second 5-transistor transconductor operates 180 degrees out of phase with the first 5-transistor transconductor.

DETAILED DESCRIPTION OF PREFERRED EMBODIMENTS

The present invention solves the problems noted above and gives the added benefit of gain control and large output swings. By setting two 5 transistor transconductors in a single circuit sharing the common mode node and running them 180 degrees out of phase, we can achieve a balanced function which leaves the current source in saturation under all conditions. Thus we have a low power circuit with good jitter performance and large output swings. Further, by either cross-coupling the PMOS loads or by using an externally generated reference, the forward gain can be either increased or decreased giving added functionality.

Figure 1:
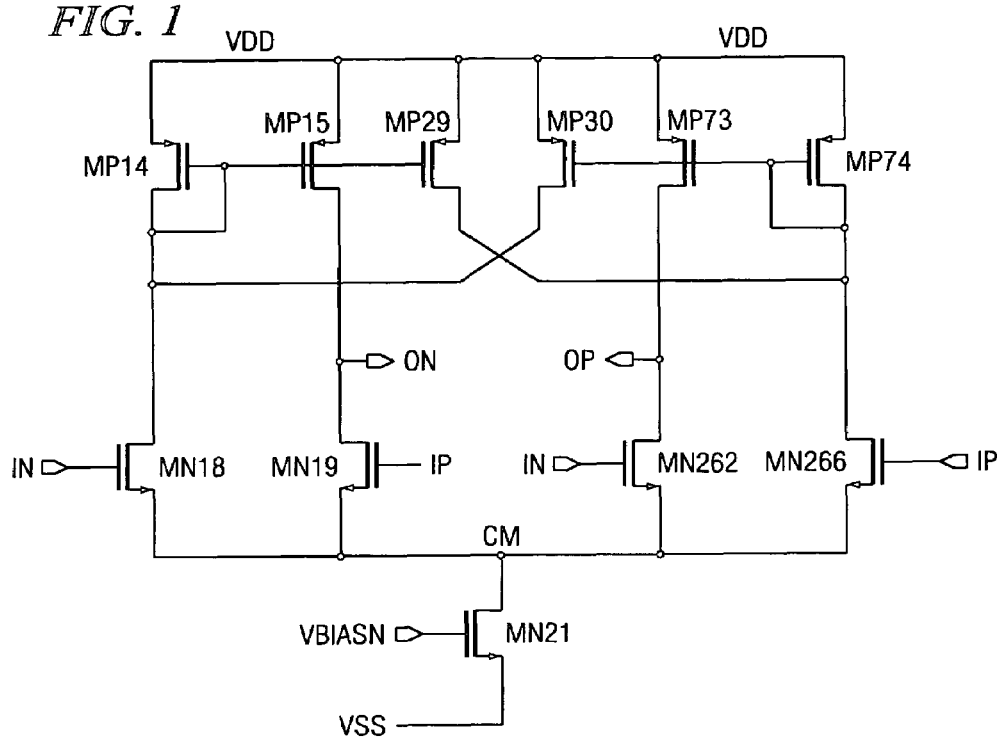
FIG. 1 is a circuit diagram of a preferred embodiment fully differential large swing variable gain amplifier, according to the present invention circuit.

The circuit in FIG. 1 is a preferred embodiment fully differential large swing variable gain amplifier, according to the present invention. The circuit can be functionally viewed as two five transistor transconductors which share a bias current source (transistor MN21 coupled to source voltage VSS). The first transconductor is composed of transistors MN18, MN19, MP14, and MP15 while the second transconductor is composed of transistors MN262, MN266, MP73, and MP74. These two transconductor circuits are operated 180 degrees out of phase (by differential inputs IN and IP) to form a balanced, fully-differential, high gain, large output swing amplifier. Transistors MP29 and MP30 are used as cross-coupled loads. Cross coupling in the fashion shown in FIG. 1 serves to increase the gain in a fixed ratio fashion where the gain increase is determined by the ratio of transistors MP29 to MP14 and MP30 to MP74.

Transistor MN21 sets a fixed bias current for the circuit. The amount of current is user selectable and is controlled through the gate connection to transistor MN21 at node VBIASN. The drain of MN21 forms the common mode node needed for proper differential functionality of the two circuits.

Two differential pairs are formed by transistor pairs MN18/MN19 and MN262/MN266 respectively. Current mirror pairs are formed by transistor pairs MP14/MP15 and MP73/MP74 respectively. Circuit operation is as follows, the logic value of output node OP follows input node IP and output node ON follows input node IN. When node IP is 'high' and node IN is 'low', the bias current provided by the current source flows in transistors MN266/MP74 and MN19. No current is flowing in transistors MN18/MP14 and MN262. The result is that the current flowing through transistor MP74 is mirrored to transistor MP73. Since node IN is 'low' no current is flowing in transistor MN262, therefore current flows through transistor MP73 long enough to pull output node OP 'high' or to source voltage VDD. Similarly, no current is flowing in transistors MN18/MP14 since node IN is 'low', therefore current flows through transistor MP19 long enough to pull node ON 'low' or to the common mode voltage at node CM. For this circuit, 'low' is defined as the voltage on the common mode node CM defined by the drain of transistor MN21 and the sources of transistors MN18/MN19/MN262/MN266.

Additionally as current begins flowing through transistor MP74 during a switching event, this current is mirrored through transistor MP30. As the current in transistor MP30 increases it draws remaining current out of transistor MN18. This 'steals' some of the current that would normally be flowing into transistor MP14 thereby shutting off transistors MP14 and MP15 more quickly. This is how the gain is increased by this configuration.

After the circuit stabilizes, all the bias current sourced by transistor MN21 is flowing through the leg containing transistors MN266/MP74. This function keeps the current flowing properly through the current source.

When node IP switches to 'low' and thus node IN switches to 'high', the bias current begins to flow through transistors MN18/MP14 and MN262. Current is being shut off in transistors MN19 and MN266/MP74. Therefore the current in transistor MP14 is being mirrored to transistor MP15. This pulls output node ON 'high'. Similarly, the current through transistor MP73 is cut off so that the current flows through transistor MN262 long enough to pull node OP 'low' or to the common mode node voltage. Similarly, the cross coupled device MP29 begins to draw current and the current rapidly switches state.

After the circuit stabilizes, all the bias current sourced by transistor MN21 is flowing through the leg containing transistors MN18/MP14. This function keeps the current flowing properly through the current source.

Figure 2:
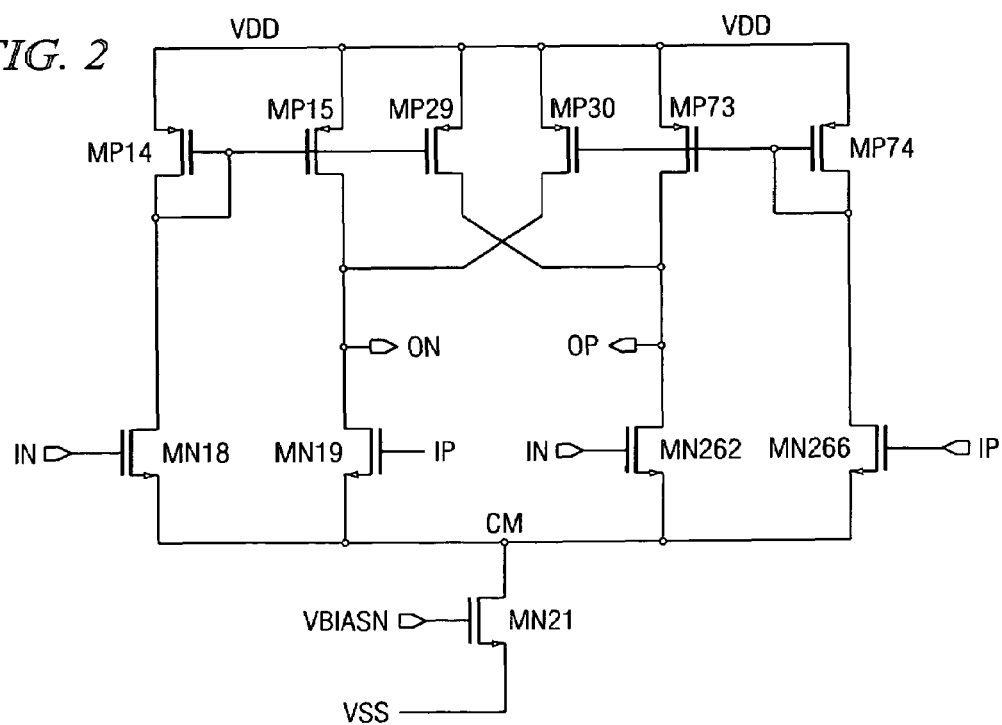
FIG. 2 is the same as the circuit of FIG. 1, except the cross coupling nodes are changed to the output nodes.

The circuit of FIG. 2 is the same as the circuit of FIG. 1, except the cross coupling nodes are changed to the output nodes. This configuration acts as an attenuator amplifier. Note that as node IP goes high, current begins flowing in transistors MN19 and MP30. The gain reduction will be a ratio of transconductances between transistors MN19 and MP30. The same function exists between transistors MN262 and MP29 as node IN goes high.

Figure 3:
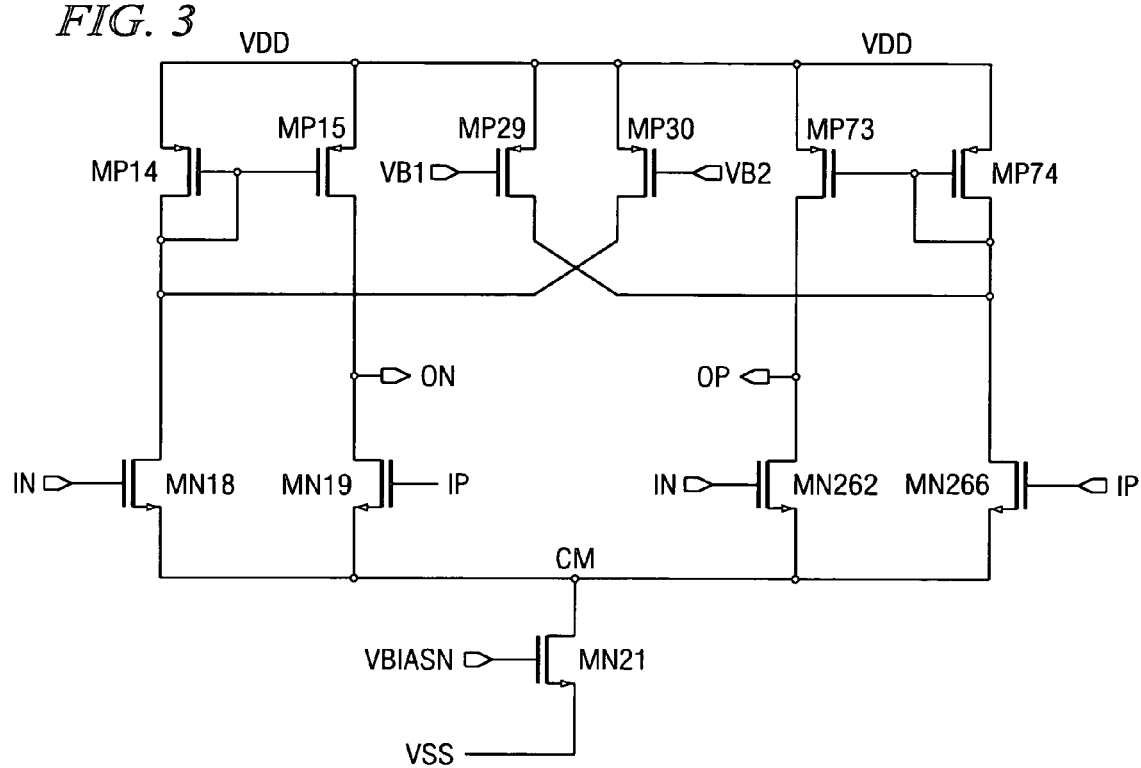
FIG. 3 is the same as the circuit of FIG. 1, except that the gates of the cross coupling devices are pulled out as separate bias nodes.
Figure 4:
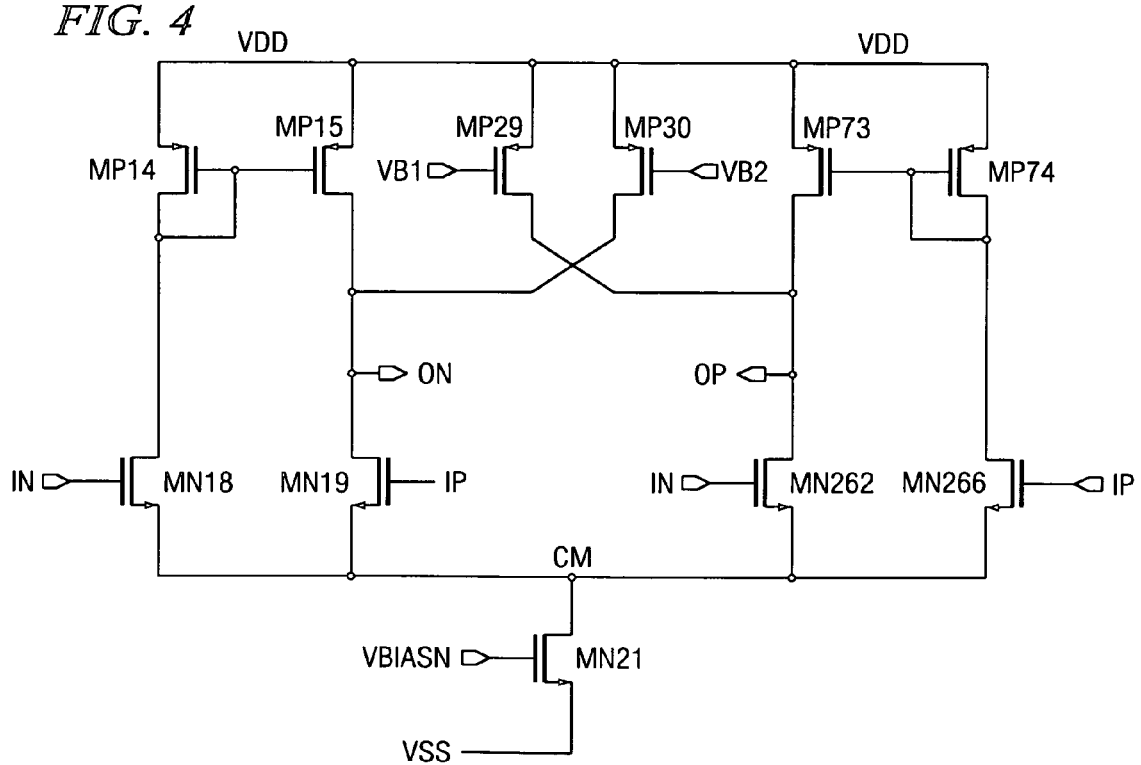
FIG. 4 is the same as the circuit of FIG. 2, except that the gates of the cross coupling devices are pulled out as separate bias nodes.

Lastly, the circuits in FIGS. 3 and 4 are the same circuits depicted in FIGS. 1 and 2, respectively, except that the gates of the cross coupling devices MP29 and MP30 are pulled out as separate nodes VB1 and VB2. These are generic depictions of the circuits being proposed. FIGS. 1 and 2 show specific implementations where fixed ratios of devices are implemented. FIGS. 3 and 4 allow for infinite tuning ranges which is the most generic implementation for these circuits.

The problems solved by this circuit are:
1. Figuring out a way to keep the current flowing through the current source without interruption. This increases the bandwidth and improves jitter performance.
2. Keeping the circuit in fully differential operation to take advantage of common mode rejection and power supply rejection.
3. Maintaining large output swings while achieving the above. Output swings from common mode to source voltage VDD.
4. Introducing cross-coupled devices in two effective configurations to give the circuit variable gain capabilities.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a first 5-transistor transconductor having a common mode node;
a second 5-transistor transconductor having a common mode node coupled to the common mode node of the first 5-transistor transconductor, wherein the second 5-transistor transconductor operates 180 degrees out of phase with the first 5-transistor transconductor; and
two cross-coupled loads, wherein a first of the two cross-coupled loads is coupled to the first 5-transistor transconductor and a second of the two cross-coupled loads is coupled to the second 5-transistor transconductor.

2. The circuit of claim 1 wherein the first and second 5-transistor transconductors share a bias current source coupled to the common mode node.

3. The circuit of claim 1 wherein the first 5-transistor transconductor comprises a first branch and a second branch; and the second 5-transistor transconductor comprises a first branch and a second branch, wherein the second branch of the first 5-transistor transconductor provides a first differential output and the second branch of the second 5-transistor transconductor provides a second differential output.

4. The circuit of claim 3 wherein the first of the two cross-coupled loads is coupled to the first branch the first 5-transistor transconductor and the second of the two cross-coupled loads is coupled to the first branch of the second 5-transistor transconductor.

5. The circuit of claim 3 wherein the first of the two cross-coupled loads is coupled to the second branch the first 5-transistor transconductor and the second of the two cross-coupled loads is coupled to the second branch of the second 5-transistor transconductor.

6. The circuit of claim 3 wherein the first of the two cross-coupled loads is coupled to the first differential output and the second of the two cross-coupled loads is coupled to the second differential output.

7. The circuit of claim 1 wherein the two cross-coupled loads comprises two transistors.

8. A circuit comprising:
a first 5-transistor transconductor having a common mode node;
a second 5-transistor transconductor having a common mode node coupled to the common mode node of the first 5-transistor transconductor, wherein the second 5-transistor transconductor operates 180 degrees out of phase with the first 5-transistor transconductor;
a first load coupled to the first 5-transistor transconductor and having a control node coupled to a first bias node; and
a second load coupled to the second 5-transistor transconductor and having a control node coupled to a second bias node.

9. The circuit of claim 8 wherein:
the first load is coupled to the first branch of the first 5-transistor transconductor; and
the second load is coupled to the first branch of the second 5-transistor transconductor.

10. The circuit of claim 8 wherein:
the first load is coupled to the second branch of the first 5-transistor transconductor; and
the second load is coupled to the second branch of the second 5-transistor transconductor.

11. The circuit of claim 8 wherein:
the first load is coupled to the first differential output; and
the second load is coupled to the second differential output.

12. The circuit of claim 8 wherein a first branch of the first 5-transistor transconductor has a control node coupled to a positive input node, a second branch of the first 5-transistor transconductor has a control node coupled to a negative input node, a first branch of the second 5-transistor transconductor has a control node coupled to the negative input node, and a second branch of the second 5-transistor transconductor has a control node coupled to the positive input node.

13. The circuit of claim 8 wherein the first 5-transistor transconductor comprises a differential pair and a current mirror pair.

14. The circuit of claim 8 wherein the second 5-transistor transconductor comprises a differential pair and a current mirror pair.

* * * * *